United States Patent [19]

Nashimoto

[11] Patent Number: 5,776,621
[45] Date of Patent: Jul. 7, 1998

[54] ORIENTED FERROELECTRIC THIN FILM ELEMENT

[75] Inventor: Keiichi Nashimoto, Kanagawa, Japan

[73] Assignee: Fuji Xerox Co., Ltd., Tokyo, Japan

[21] Appl. No.: 547,905

[22] Filed: Oct. 25, 1995

Related U.S. Application Data

[63] Continuation of Ser. No. 172,209, Dec. 23, 1993, abandoned.

[30] Foreign Application Priority Data

Dec. 25, 1992 [JP] Japan ................ 4-358050

[51] Int. Cl.$^6$ ........................................ B32B 9/00
[52] U.S. Cl. ................. 428/688; 428/210; 428/689; 428/701; 428/702; 428/901; 505/701
[58] Field of Search ....................... 428/688, 689, 428/701, 702, 210, 901; 505/701

[56] References Cited

U.S. PATENT DOCUMENTS

| | | | |
|---|---|---|---|
| 3,808,674 | 5/1974 | Francombe | 29/446 |
| 4,211,821 | 7/1980 | Hadni | 428/411 |
| 5,225,031 | 7/1993 | McKee | 156/612 |
| 5,270,298 | 12/1993 | Ramesh | 361/313 |
| 5,317,446 | 5/1994 | Mir | 359/296 |
| 5,323,023 | 6/1994 | Fork | 505/701 |
| 5,403,673 | 4/1995 | Haga | 428/688 |
| 5,514,484 | 5/1996 | Nashimoto | 428/688 |

FOREIGN PATENT DOCUMENTS

| | | |
|---|---|---|
| 61-185808 | 8/1986 | Japan . |
| 162369 | 7/1987 | Japan . |
| 3-262173 | 11/1991 | Japan . |
| 3262173 | 11/1991 | Japan . |

OTHER PUBLICATIONS

Iijima, J Appl. Phys. 60(1) 7–86, pp. 361–367, 1986.

*Primary Examiner*—William Krynski
*Attorney, Agent, or Firm*—Finnegan, Henderson, Farabow, Garrett & Dunner, L.L.P.

[57] ABSTRACT

An oriented ferroelectric thin film element has a structure in which an epitaxial or oriented buffer thin film is formed on a semiconductor single crystal substrate, an epitaxial or oriented metallic thin film is formed on the buffer thin film, and an epitaxial or oriented ferroelectric thin film is further formed on the metallic thin film. The semiconductor single crystal substrate may be made of Si or GaAs, the buffer thin film may be made of MgO or $MgAl_2O_4$, the metallic thin film may be made of Pd, Pt, Al, Au, or Ag, and the ferroelectric thin film has an $ABO_3$ perovskite crystal structure.

11 Claims, 1 Drawing Sheet

ORIENTED FERROELECTRIC THIN FILM ELEMENT

This application is a continuation of application Ser. No. 08/172,209, filed Dec. 23, 1993, now abandoned.

BACKGROUND OF THE INVENTION

The present invention relates to an oriented ferromagnetic thin film element in which an epitaxial or oriented ferroelectric thin film is formed on a semiconductor single crystal substrate through an epitaxial or oriented buffer layer and metallic layer, and can be used when a non-volatile memory, capacitor or optical modulator is made on a semiconductor substrate.

Conventionally, it has been expected that an oxide ferroelectric thin film, because of many properties such as ferroelectricity, piezoelectricity, pyroelectricity and electrooptical effect of the ferroelectric, is applied to many fields such as a surface acoustic element, infrared pyroelectric element, acoustic optical element and an electrooptical element, in addition to a non-volatile memory. In these applications, to form a single crystal thin film is indispensable to realize low optical loss in a thin film optical waveguide structure, and polarization characteristic and electrooptical effect like those of a single crystal. Therefore, many attempts have been made in which an epitaxial ferroelectric thin film made of $BaTiO_3$, $PbTiO_3$, $Pb_{1-x}Ld_x(Zr_{1-y}Ti_y)_{1-x/4}O_3$(PLZT) where $0 \leq x$, $y \leq 1$, $LiNbO_3$, $KNbO_3$, or $Bi_2Ti_3O_{12}$ is formed on an oxide single crystal substrate by the methods of Rf-magnatron sputtering, ion-beam sputtering, laser abrasion, organic metal chemical vapor deposition (MOCVD), etc.

On the other hand, in order to integrate the ferroelectric thin film with a semiconductor element, it must be formed on a semiconductor substrate. It is difficult to grow the ferroelectric thin film epitaxially on the semiconductor substrate because of high growth temperature, interactive diffusion between the semiconductor and ferroelectric and the oxidization of the semiconductor. Especially, it is difficult to grow the ferroelectric thin film epitaxially on a GaAs substrate for the following reason. With respect to GaAs, it is known that at 400° C. or more, As on the surface decreases, and at 690° C. or more, As and Ga start to sublimate one layer by one layer in an atmosphere with no $As_4$. There are few reports on forming the ferroelectric thin film on a GaAs substrate. It has been reported that when the PLZT is grown on the GaAs substrate, the diffusion Pb into GaAs is detected.

For these reasons, it is necessary to grow on the semiconductor substrate a capping layer as a buffer layer which epitaxially grows at low temperatures on the semiconductor substrate, promotes the epitaxial growth of the forroelectric thin film and also serves as a diffusion barrier.

Japanese Patent Unexamined Publication No. Sho. 61-185808 discloses that A forroelectric compound is epitaxially grown on a substrate with Spinel $MgAl_2O_4$ (100) or magnesium oxide MgO (100) epitaxially grown as a buffer layer on an Si (100) single crystal. However, the application of this technique to an element is limited since there is no electrode between the ferroelectric thin film and $MgAl_2O_4$ or MgO. Japanese Patent Unexamined Publication No. Hei. 3-262173 discloses that a (111) oriented noble metal thin film is formed on a (111) surface of a semiconductor single crystal substrate and a (111) oriented ferroelectric thin film is formed on the noble metal thin film.

It is known to form the (111) oriented noble metal thin film on the (111) surface of the single crystal substrate and form the (111) oriented ferroelectric thin film on the noble metal thin film. However, it is well known that such a noble metal is likely to take a (111) oriented spontaneously because of its surface energy. Thus, it is difficult to form a film except a poly-crystalline film in which an in-face orientation is random though it has the (111) orientation. Further, when the metal is directly formed on the semiconductor, it is difficult to avoid the reaction of metal with the semiconductor. For example, Pt forms silicide with the Si substrate. Even if Pt initially makes (111) epitaxial or oriented growth, the (111) orientation is actually often lost because of the temperature during the growth of the ferroelectric thin film. Further, it is difficult to make (100) epitaxial growth on the (100) surface of the semiconductor single crystal substrate because of the above reaction although the lattice mismatching in the orientation of semiconductor |001|//Pt |011| is small. Further, the spontaneous (100) orientation does not occur in view of energy so that the noble metal thin film of polycrystal or (111) orientation can only be obtained. The above reaction results in remarkable difficulty in compound semiconductors such as GaAs which is chemically more unstable them Si.

So, it is proposed to insert between a metal thin film and a semiconductor a buffer layer having lattice matching to the metal thin film and the semiconductor. For example, it is known that Pt can be epitaxially grown on an MgO single crystal substrate. A reference (K. Iijima et. *J. Appl. Phys.* 60 (1986), p 361) disclose that (111) oriented Pt is epitaxially grown on the MgO (100) single crystal substrate.

However, it has been considered that it is generally impossible to grow an oxide buffer layer such as MgO on a semiconductor, particularly, on a compound semiconductor because of the lattice mismatching between an oxide buffer layer and the compound semiconductor, changes in the atomic structure on the surface of the compound semiconductor during the high temperature growth of the oxide buffer layer, mutual diffusion between the oxide buffer layer and the compound semiconductor and oxidization or the surface of the compound semiconductor during the growth of the buffer layer. For example, as described before, it is known that on a GaAs substrate, at 400° C. or more, As on the surface decreases, and at 690° C. or more, AS and Ga start to sublimate one layer by one layer in an atmosphere with no $As_4$. Also, when the PLZT is grown on the GaAs substrate, the diffusion of Pb is detected.

It is expected that ferroelectric represented by $ABO_3$ type perovskite oxide is applied to many light modulators such as an acoustic optical element, an electrooptical element and a secondary higher harmonic element. These applications include a bulk acoustooptic clement or bulk electrooptical element using ordinary ceramic or single crystal material. However, these elements are bulky and requires a high driving voltage. In the application of the secondary higher harmonic element and light modulator having a thin film optical waveguide structure, many optical waveguides such au a Ti diffusion type single crystal $LiNbO_3$ optical waveguide and an epitaxial thin film optical waveguide of $Pb_{1-x}La_x(Zr_{1-y}Ti_y)_{1-x/4}O_3$ thin film or $LiNbO_3$ thin film grown from a vapor phase on a sapphire substrate, arc formed on an oxido single crystal substrate.

For example, the light modulator using the Ti diffusion type single crystal $LiNbO_3$ optical waveguide includes a secondary higher harmonic element using the Ti diffusion type single crystal $LiNbO_3$ optical waveguide of a periodic domain inversion structure and an optical scanner based on the acoustooptic effect using surface elastic waves. Further, the light modulator using the thin film optical waveguide includes a total internal reflection (TIR) type optical switch based on the electrooptical effect due to the epitazial $Pb_{1-x}La_x(Zr_{1-y}Ti_y)_{1-x/4}O_3$ thin film optical waveguide on a sapphire substrate and a light deflector based on the acoustooptic effect using the surface elastic wave on an oriented polycrystalline piezoelectric ZnO thin film optical waveguide on a GaAs substrate. However, in the hybrid thin film electrooptical element according to the diffusion type optical waveguide using the single crystal and the thin film optical waveguide formed on the oxide single crystal substrate, the coupling efficiency of light from a semiconductor laser to an electrooptical element is problematic. Further, such an element has room to be made compact because of its hybrid structure and requires high production cost.

On the other hand, from the standpoint of monolithic integration of a ferroelectric light modulator with a semiconductor laser, the epitaxial growth of a ferroelectric thin film on a compound semiconductor substrate represented by GaAs from which a semiconductor laser is made, is very meritorious. The epitaxial thin film is also very meritorious in view of availability of single crystal and complexity of making an optical waveguide using the single crystal. Also, the thin film optical waveguide is meritorious in that it can provide refraction index conditions and low optical attenuation for an optical waveguide mode and the characteristics comparable to a single crystal.

SUMMARY OF THE INVENTION

The present invention has been completed under the above circumstance in the conventional technique. An object of the present invention is to provide an oriented ferroelectric thin film element with a metallic thin film on a semiconductor substrate.

As a result of further studies by the inventor, it was found that if a buffer thin film of epitaxial or oriented MgO or $MgAl_2O_4$ is formed on a semiconductor single crystal substrate, metal such as Pd, Pt, Al, Au and Ag can be formed with its epitaxy or orientation on the buffer thin film, and the present invention was completed.

The oriented ferroelectric thin film element according to the present invention is, therefore, characterized in that an epitaxial or orrented buffer thin film is formed on a semiconductor single crystal substrate, an epitaxial or oriented metallic thin film is formed on the buffer thin film and an epitaxial or oriented ferroelectric thin film is further formed on the metallic thin film.

DETAILED DESCRIPTION OF THE PREFERRED EMBODIMENTS

Figure 1:
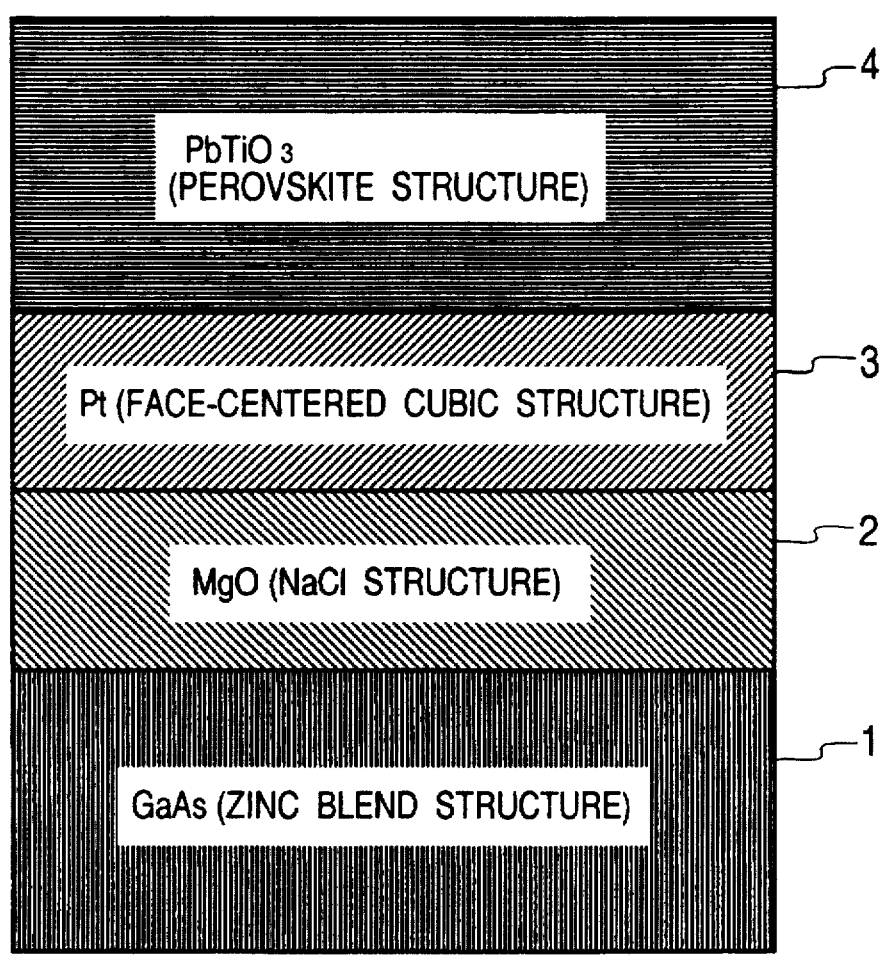
FIG. 1 is a schematic sectional view of the oriented ferroelectric thin film element according to an embodiment of the present invention.

The present invention will be explained below in detail.

In the present invention, a semiconductor single crystal substrate may be made of an element semiconductor or compound semiconductor. The element semiconductor includes Si, Ge, diamond, etc. The compound semiconductor may be a III–V series compound semiconductor including AlAS, AlSb, AlP, GaAs, GaSb, InP, InAs, InSb, AlGaP, AlLnP, AlGaAs, AlInSb, AlAsSb, GaInAs, GaInSb, GaAsSb, InAsSb, etc. and a II–VI series compound semiconductor including znS, ZnSe, ZnTe, CaSe, CdTe, HgSe, HgTe, CdS, etc.

The epitaxial or oriented buffer thin film formed on the semiconductor single crystal substrate is preferred to be MgO or $MgAl_2O_4$. The buffer thin film can be formed by the vapor-phase growth method selected from electron beam deposition, flash deposition, ion plating, Rf-magnetron sputtering, ion-beam sputtering, laser abrasion, molecular beam epitaxy (MBE), chemical vapor deposition (CVD), plasma CVD, organic metal chemical vapor deposition (MOCVD), etc., and the wet process such as the sol-gel method.

The epitaxial or oriented metallic thin film formed on the buffer thin film can be formed by the vapor-phase deposition selected from the electron beam deposition, flash deposition, ion plating, Rf-magnetron sputtering, ion-beam sputtering, lazer abrasion, molecular beam eopitaxy (MBE), otc.

The metal to be used is preferred to be the metal having the lattice constant approximate to that of the buffer thin film and ferroelectric. For example, if the buffer thin film is made of MgO or $MqAl_2O_4$ and the ferroelectric is $BaTiO_3$ or $PbTiO_3$, Pd, Pt, Al, Au, or Ag is preferable (eoo Table 1 described later).

On the metallic thin film, an epitaxial ox oriented ferroelectric thin film is formed. In this case the ferroelectric should have an $ABO_1$ type perovskite structure. For example, the ferroelectric of the $ABO_3$ type perovskite may be $BaTiO_3$, $PbTiO_3$, $Pb_{1-x}La_x(Zr_{1-y}Ti_y)_{1-x/4}O_3$(PLZT) where $0 \leq x$, $y \leq 1$, $LiNgbO_3$, $KNbO_3$ or $Bi_4Ti_3O_{12}$. This ferroelectric thin film can be formed by the vapor-phase growth method selected from electron beam deposition, flash deposition, ion plating, Rf-magnetron sputtering, ion-beam sputtering, laser abrasion, molecular beam epitaxy (MBE), chemical vapor deposition (CVD), plasma CVD, organic metal chemical vapor deposition (MOCVD), etc., and the wet process such as the sol-gel method.

Incidentally, Table 1 shows the crystal structure and lattice constant of the material which is preferably used.

TABLE 1

| Crystal | Crystal structure | | Lattice constant (Å) | |
|---|---|---|---|---|
| | | | a-axis | c-axis |
| $BaTiO_3$ | perovskite | tetragonal crystal system | 3.994 | 4.038 |
| $PbTiO_3$ | perovskite | tetragonal crystal system | 3.905 | 4.153 |
| Pd | face-centered cubic | cubic crystal system | 3.8898 | |
| Pt | face-centered cubic | cubic crystal system | 3.9231 | |
| Al | face-centered cubic | cubic crystal system | 4.0494 | |
| Au | face-centered cubic | cubic crystal system | 4.0786 | |
| Ag | face-centered cubic | cubic crystal system | 4.0862 | |
| MgO | NaCl | cubic crystal system | 4.213 | |
| $MgAl_2O_4$ | spinel | cubic crystal system | 8.083 (½-4.042 |  |

TABLE 1-continued

| Crystal | Crystal structure | Lattice constant (Å) a-axis | c-axis |
|---|---|---|---|
| Si | diamond | cubic crystal system | 5.4301 |
| GaAs | zinc blend | cubic crystal system | 5.6534 |

The ferroelectric thin film element preferred in the present invention has a structure in which epitaxial or oriented MgO buffer layer is formed on a semiconductor single crystal substrate, an epitaxial or oriented metallic thin film is formed on the buffer thin film and an epitaxial or oriented forroelectric thin film is further formed on the metallic thin film.

Since the oriented ferroelectric thin film element according to the present invention has the above structure, the double layer composed of the buffer layer and the metallic thin film on the semiconductor single crystal substrate promotes the epitaxial growth of the ferroelectric thin film and serves as a diffusion barrier, and the metallic thin film serves also as the underlying electrode of an element using the ferroelectric thin film.

EXAMPLE 1

The growth of epitaxial layers on a GaAs substrate was performed by the excimer laser deposition method in which the surface of a target is heated instantaneously by UV laser pulses to implement deposition. As the laser, an Xecl excimer laser (wavelength: 308 nm) was used under the conditions of a pulse period of 4 Hz, a pulse width of 17 ns and energy of 130 mJ (energy density of 1.3 J/cm$^2$ on the target surface). The distance between the target and the substrate was 50 mm. As the target, metal Mg was used because PbTiO$_3$, Pt and MgO have no absorption at the wavelength of 308 nm. Since MgO has a high binding energy of 10 oV or mores O$_2$ gas was introduced while the film was formed. As a result, Mg was easily oxidized. The substrate was heated by a halogen lamp.

As the GaAs substrate, an n-type (100)±0.2°, 6×6 mm wafer was used. The substrate, after having been washed by solvent, was etched by an H$_2$SO$_4$ based solution. The substrate was rinsed using de-ionized water and ethanol, and finally spin-dried using ethanol under a flow of nitrogen. There is a report that a single oxidized film on the GaAs substrate surface formed by the de-ionized water rinsing after etching serves as a passivation layer and dissociates at 582° C. For this reason, immediately after the spin drying, the substrate was introduced into a deposition chamber, and heated under the condition of a predetermined temperature and a background pressure of 3×10$^{-7}$ Torr to isolate (sublimate) the passivation layer on the GaAs surface. Subsequently, the film of MgO was grown to the thickness of 100–1000 angstrom (Å).

The X-ray diffraction analysis showed that although the grown Mgo film became an (100)-face uni-orientation epitaxial film under the condition of a broad range, it became a good quality thin film particularly under the condition of 250°–450° C. and ×10$^{-6}$–1×10$^{-4}$ Torr O$_2$. In order to identify the relation in in-face crystal orientation between Mgo and GaAs, X-ray diffraction phi-scan was carried out. The phi-scan for the (202) face forming an angle of 45° with respect to the face of (100) in cubic crystal showed a sharp peak having a rotary period of 90° for MgO in MgO (100)//GaAs (100); its position accorded with the peak position of GaAs. From these facts, it was found that the crystallographic relation between MgO and GaAs is such that although there is lattice mismatch of 25.5%, the relation in crystal orientation between MgO and GaAs is MgO (100)//GaAs (100) and the in-face orientation MgO |001|// GaAs |001|.

The observation of the phase boundary between MgO and GaAs by a high-resolution transmission electron microscope showed that tho two-dimensional super-lattice due to the lattice matching of MgO: GaAs=4:3 is formed at the phase boundary and the boundary is an abrupt boundary with no secondary layer formed. With respect to the lattice matching of 4:3, there is lattice matching of 0.7% for MgO: GaAs= 4:3, there is lattice mismatching. Nevertheless, it is considered that the epitaxial growth of MgO |001|//GaAs |001| was realized as a result that the in-film stress was relaxed.

Next, Pt crystal was epitaxially grown on the MgO thin film under the condition of 500°–700° C. and background pressure of 3×10$^{-7}$ Torr. The X-ray diffraction analysis of the Pt thin film 500–2000 Å thick grown on the MgO butter layer showed the relation in crystal orientation of Pt (100) //MgO (100)//GaAs (100) and the in-face orientation Pt |100|//MgO |001|//GaAs |001|.

Further, a PbTiO$_3$ crystal was grown with epitaxy or orientation under the condition of 1×10$^{-4}$–1×10$^{-2}$ Torr O$_2$ to form a PbTiO$_3$ thin film having a thickness of 500–5000 Å grown on the Pt thin film. The X-ray diffraction analysis showed that the PbTiO$_3$ film has substantially complete c-axis orientation and the relation in crystal orientation is PbTiO$_3$ (001)//Pt (100)//NgO (100) if GAAs (100) and the in-face orientation PbTiO$_3$ |010|//Pt |001|//MgO |001|// GaAs The schematic section of the ferroelectric thin film element thus obtained is shown in FIG. 1. In FIG. 1, numeral 1 denotes a GaAs single crystal substrate (zinc blend structure); 2 an MgO thin film (NaCl structure); 3 a Pt thin film (face-centered cubic), and 4 a PbTiO$_3$ thin film (perovskite structure).

The observation of the surface of the PbTiO$_3$ thin film by a scanning electron microscope showed that it was very smooth. It means that the PbTiO$_3$ thin film has the surface smoothness exhibiting a low optical attenuation characteristic which is preferable for an optical waveguide. Further, in the capacitor structure of 1000 Å Pt / 3000 Å PbTiO$_3$ / 1000 Å Pt / 1000 Å MgO / GaAs, the polarization characteristic of the PbTiO$_3$ was measured by applying a voltage between the PL films. The P-E characteristic based on this structure showed a hysteresis loop. As a result, it was found that PbTiO$_3$, as estimated by its structure analysis, has a ferroelectric phase (tetragonal crystal system) with a polarization axis oriented perpendicularly to the single crystal GaAs substrate.

EXAMPLE 2

The epitaxial MgO buffer layer was grown on an Si substrate in substantially the same way as in Example 1. As the Si substrate, an n- or p-type, (100) face, 6×6 mm wafer was used. The substrate with the MgO buffer layer thus formed, after having been washed by solvent in substantially the same way as in Example 1, was etched using HF and dried. Immediately thereafter, the substrate was introduced into a deposition chamber, and heated under the condition of a predetermined temperature of 500° C. or more and a background pressure of 3×10⁻⁷ Torr to isolate (sublimate) the H passivatation layer on the Si surface. Subsequently, the film of MgO was grown to the thickness of about 500 Å under the condition of 200°–600° C., 1×10⁻⁶–1×10⁻³ Torr)$_2$. Thus, an epitaxial thin film was obtained which has the MgO-Si relations in their in-face crystal orientation of MgO (100)//Si (100) and MgO |001|//Si |0011|. Further, a Pt thin film having a thickness of 1000–2000 Å was epitaxially grown on the MgO buffer layer under the condition of 500°–700° C. and background pressure of 3×10⁻⁷ Torr, thus providing the relation in crystal orientation of Pt (100)// MgO (100)//Si (100) and Pt |001|//MgO |001|//Si |001|.

Subsequently, PbTiO$_3$ was grown in its c-axis orientation under the condition of 600°–800° C. and 1×10⁻⁴–1×10⁻² Torr O$_2$ to form a PbTiO$_3$ film having a thickness of 1000–3000 Å grown on the Pt thin film. The relations in crystal orientation between PbTiO$_3$ and Pt / MgO / Si identified by X-ray diffraction patterns were PbTiO$_3$ (001) //Pt (100)//Mgo (100)//Si (100) and PbTiO$_3$ |100|//Pt |001| //MgO |001|//Si |001|.

In the same way, Pb$_{1-x}$Ti$_x$O$_3$ (PZT) and Pb$_{1-x}$La$_x$(Zr$_{1-y}$Ti$_y$)$_{1-x/4}$O$_3$(PLZT) could also be epitaxially grown on the Si substrate through the epitaxial MgO buffer layer and Pt thin film. Incidentally, in this example, the relations in crystal orientation of PbTiO$_3$ |001|)//Pt |100|//MgO (100)/ /Si (100) and PbTiO$_3$ |001|//Pt |100|//MgO |100|//Si |100| were obtained. The relation in crystal orientation is not limited to the above relations. For example, the relation in crystal orientation may be the epitaxy or orientation relation of ABO$_3$//metal (111)//MgO (111)//semiconductor (111).

In the above examples, the film growth was performed by the excimer loser deposition method. But the film growth process should not be limited to it. Then film growth can be performed also by the vapor-phase growth method selected from Rf-magnetron sputtering, ion-beam sputtering, electron beam deposition, flash deposition, ion plating, molecular beam epitaxy (MBE), ionized cluster beam epitaxy, chemical vapor deposition (CVD), organic metal chemical vapor deposition (MOCVD), plasma CVD, etc., and the wet process such as tho sol gel method.

In the present invention, since a double layer structure composed of a buffer thin film and a metallic thin film is formed on a semiconductor single crystal substrate and this double layer promotes the epitaxial growth of a ferroelectric thin film and also serves as a diffusion barrier, it is possible to implement the oriented growth of the ferroelectric thin film on the semiconductor single crystal substrate. Further, since the metallic thin film is formed, it can also serve as an underlying electrode in the element including the ferroelectric thin film; thus this element can be used as a non-volatile memory having a sophisticated function or a capacitor.

Further, the oriented ferroelectric thin film element according to the present invention, since orientation of the films can be controlled, can provide a large residual polarization value, electrooptical constant, etc. A three-dimensional element can be made by a combination of a ferroelectric switch element and a semiconductor integrated circuit. Further, although the refractive index of ferroelectric is generally smaller than that of semiconductor, the metallic thin film between the ferroelectric and the semiconductor permits semiconductor laser light to be confined in the optical wave guide of the ferroelectric thin film. Using the oriented ferroelectric thin film element according to the present invention, therefore, an optical modulator can be made on a GaAs series semiconductor laser element, and an optical integration circuit can be made on an Si semiconductor integrated circuit.

What is claim is:

1. An oriented ferroelectric thin film element, comprising:

a semiconductor single crystal substrate;

an epitaxial oxide buffer thin film formed on said semiconductor single crystal substrate;

an epitaxial metallic thin film formed on said oxide buffer thin film; and an epitaxial ferroelectric thin film formed on said metallic thin film.

2. An oriented ferroelectric thin film element according to claim 1, wherein said semiconductor single crystal substrate is made of an element semiconductor.

3. An oriented ferroelectric thin film element according to claim 1, wherein said semiconductor single crystal substrate is made of a compound semiconductor.

4. An oriented ferroelectric thin film element according to claim 2, wherein said element semiconductor is one selected from the group consisting of Si, Ge, and diamond.

5. An oriented ferroelectric thin film element according to claim 2, wherein said element semiconductor is Si.

6. An oriented ferroelectric thin film element according to claim 3, wherein said compound semiconductor is III–V series compound semiconductor.

7. An oriented ferroelectric thin film element according to claim 6, wherein said III–V series compound is GaAs.

8. An oriented ferroelectric thin film element according to claim 1, wherein said oxide buffer thin film is made of one selected from the group consisting of MgO and MgAl$_2$O$_4$.

9. An oriented ferroelectric thin film element according to claim 1, wherein said metallic thin film is one selected from the group consisting of Pd, Pt, Al, Au, and Ag.

10. An oriented ferroelectric thin film element according to claim 1, wherein said ferroelectric thin film has an ABO$_3$ perovskite crystal structure.

11. An oriented ferroelectric thin film element according to claim 10, wherein said ferroelectric thin film having an ABO$_3$ perovskite crystal structure is one selected from the group consisting of BaTiO$_3$, PbTiO$_3$, Pb$_{1-x}$La$_x$(Zr$_{1-y}$Ti$_y$)$_{1-x/4}$O$_3$ where $0 \leq x$, $y \leq 1$, LiNbO$_3$, KNbO$_3$ and Bi$_4$Ti$_3$O$_{12}$.

* * * * *